United States Patent [19]

Senma et al.

[11] Patent Number: 4,856,008

[45] Date of Patent: Aug. 8, 1989

[54] SEMICONDUCTOR LASER CONTROL APPARATUS

[75] Inventors: Toshitaka Senma, Yokohama; Tomoatsu Imamura, Isehara; Kazuyuki Shimada, Chofu, all of Japan

[73] Assignee: Ricoh Company, Ltd., Tokyo, Japan

[21] Appl. No.: 290,441

[22] Filed: Dec. 27, 1988

[30] Foreign Application Priority Data

Dec. 29, 1987 [JP] Japan ................................ 62-336547
Jan. 22, 1988 [JP] Japan .................................. 63-10879

[51] Int. Cl.⁴ ............................................... H01S 3/13
[52] U.S. Cl. .................................................... 372/31
[58] Field of Search ............................. 372/29, 31, 38

[56] References Cited

U.S. PATENT DOCUMENTS 4,689,795 8/1987 Yoshimoto et al. ................... 372/31
4,745,609 5/1988 Yoshikawa ............................ 372/38

Primary Examiner—James W. Davie
Attorney, Agent, or Firm—Cooper & Dunham

[57] ABSTRACT

A semiconductor laser control apparatus for controlling an intensity of light emitted from a semiconductor laser by controlling a drive current to by supplied to the semiconductor laser, includes a first circuit which roughly determines a first value of the drive current so as to obtain a intensity of light near a desired intensity of light emitted from the laser diode, a second circuit which precisely determines a second value of the drive current so as to obtain the desired intensity of light, after determining the first value of the drive current by the first circuit, and an adder which adds the first value of the drive current determined by the first circuit and the second value of the drive current determined by the second circuit. The drive current having an added value is supplied to the semiconductor laser.

12 Claims, 16 Drawing Sheets

SEMICONDUCTOR LASER CONTROL APPARATUS

BACKGROUND OF THE INVENTION

The present invention generally relates to a semiconductor laser control apparatus, and in particular, to an apparatus for controlling the intensity of a beam emitted from a semiconductor laser built in a laser printer, a facsimile machine, a digital copier or the like.

Conventionally, an automatic output control circuit for use in a semiconductor laser uses an 8-bit digital-to-analog converter, by which a resolution of 1/256 is obtainable. Hereafter, a digital-to-analog converter is simply referred to as a D/A converter. However, there is a great variation in the output density of a semiconductor laser due to a quantization error in the 8-bit D/A converter. For example, when a current for driving the semiconductor laser ranges from 20 mA to 120 mA, it is difficult to control the output of the semiconductor laser with sufficient accuracy. From this viewpoint, a semiconductor laser control apparatus is known in which a 12-bit D/A converter is employed in order to reduce the quantization error. However, the use of the 12-bit D/A converter requires an extremely large amount of time when the output of the semiconductor laser is initially set. Additionally, commercialized 12-bit D/A converters are more expensive than 8-bit D/A converters.

FIG. 1 is a block diagram of a conventional semiconductor laser control apparatus. Referring to FIG. 1, a semiconductor laser (hereinafter referred to as a laser diode) 10 is driven by a drive signal supplied from a semiconductor laser drive circuit (hereafter simply referred to an LD drive circuit) 11. The laser diode 10 emits laser beams forward and backward. The light beam emitted forward is irradiated on a recording medium (not shown), and the light beam emitted backward is projected onto a photosensor 12. The photosensor 12 produces an output current proportional to the intensity of the laser beam emitted from the laser diode 10. The output current is converted into a voltage signal $V_M$ by an amplifier 13. The converted voltage is compared with a reference voltage $V_{ref1}$ by a comparator 14. The comparator outputs a signal switchable between low and high levels depending on the comparison result. The output signal derived from the comparator 14 is used to control the count mode of an up/down counter 15. Hereinafter, the up/down counter is simply referred to as a counter. When the output voltage $V_M$ is lower than the reference voltage $V_{ref1}$, or in other words, the light intensity of the laser diode 10 does not reach a reference value P (FIG. 2), the output signal of the comparator 14 is kept at the high level, so that the counter 15 is set to an up count mode in which the counter 15 functions as an up counter. On the other hand, when the output voltage $V_M$ is higher than the reference voltage $V_{ref1}$, the counter 15 is set to a down count mode in which the counter 15 functions as a down counter.

A flip-flop (hereafter simply referred to as an F/F) 16 is set by the application of a power set signal S1, which is supplied at the commencement of a standby mode. Then the F/F 16 releases the counter from a disabled state. Thereby, the counter 15 counts a clock pulse generated by a clock pulse generator 17 in accordance with the output signal of the comparator 14 applied to an up/down (U/D) terminal of the counter 15.

The counter 15 gradually increases or decreases the count value therein, depending to the variation in the intensity of the light emitted from the laser diode 10. The count value is converted into an analog signal by a D/A converter 18. A converted analog signal is supplied to the LD drive circuit 11, which changes the drive signal to be supplied to the laser diode 10. Thereby, the intensity of the light emitted from the laser diode 10 is controlled. An edge detection circuit 19 detects an edge of the rise (or fall) of the output signal of the comparator 14, and resets the F/F 16. Thereby, the counter 15 returns to the disable state.

The above-mentioned operation is illustrated in FIG. 2. At the time of the first power setting operation upon power ON, the light intensity of the laser diode 10 is increased up to the reference value P, and is kept thereat. Then, at the time of the power setting operation on and after the second time is carried out by starting the power setting control from the reference value P, and increases the light intensity to the reference value P.

However, the conventional structure has the disadvantages described below. As described previously, the intensity of the light emitted from the laser diode 10 is increased to the reference value P by the single D/A converter 18. Therefore, the light intensity varies greatly due to the quantization error which occurs in the D/A converter 18. Further, a smooth and rapid power setting control is not obtainable, particularly when the D/A converter 18 is constituted by the 12-bit D/A converter.

SUMMARY OF THE INVENTION

It is therefore a general object of the present invention to provide a novel and useful semiconductor laser control apparatus in which the aforementioned disadvantages are eliminated.

A more specific object of the present invention is to provide an economical semiconductor laser control apparatus capable of automatically controlling the semiconductor laser diode with high accuracy and high speed.

The above objects of the present invention can be achieved by a semiconductor laser control apparatus for controlling an intensity of light emitted from a semiconductor laser by controlling a drive current to be supplied to the semiconductor laser, including the following structural elements. A monitor circuit monitors the intensity of light emitted from the semiconductor laser. A first circuit roughly determines a first value of the drive current by using the intensity of light monitored by the monitor circuit so as to obtain a intensity of light near a desired intensity of light emitted from the laser diode. A second circuit precisely determines a second value of the drive current by using the intensity of light monitored by the monitor circuit so as to obtain the desired intensity of light, after determining the first value of the drive current by the first circuit. An adder adds the first value of the drive current determined by the first circuit and the second value of the drive current determined by the second circuit, the drive current having an added value being supplied to the semiconductor laser.

Other objects, features and advantages of the present invention will become apparent from the following

DETAILED DESCRIPTION OF THE PREFERRED EMBODIMENTS

Figure 1:
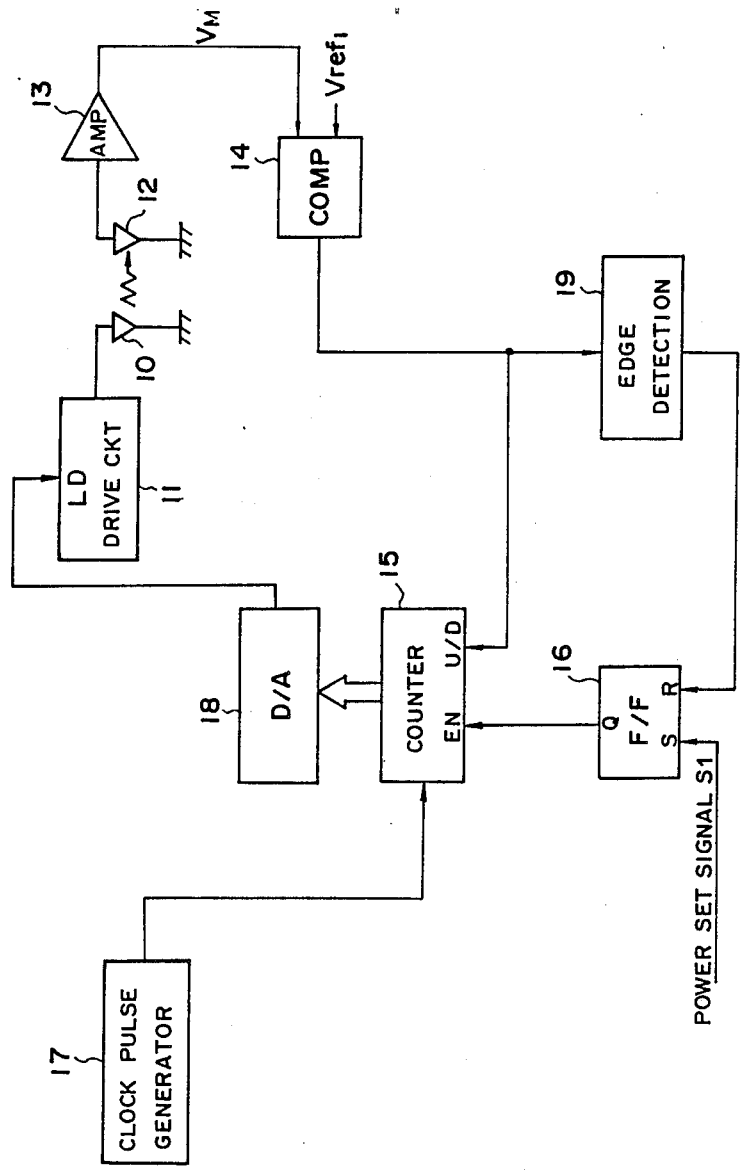
FIG. 1 is a block diagram of the conventional semiconductor laser control apparatus.
Figure 2:
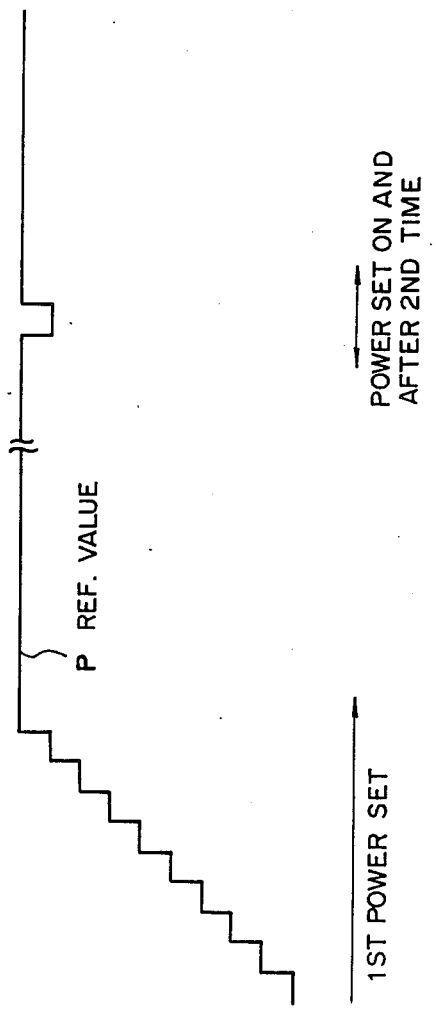
FIG. 2 is a graph showing the controlled intensity of light emitted from the laser diode achieved by the semiconductor laser control apparatus of FIG. 1.
Figure 3:
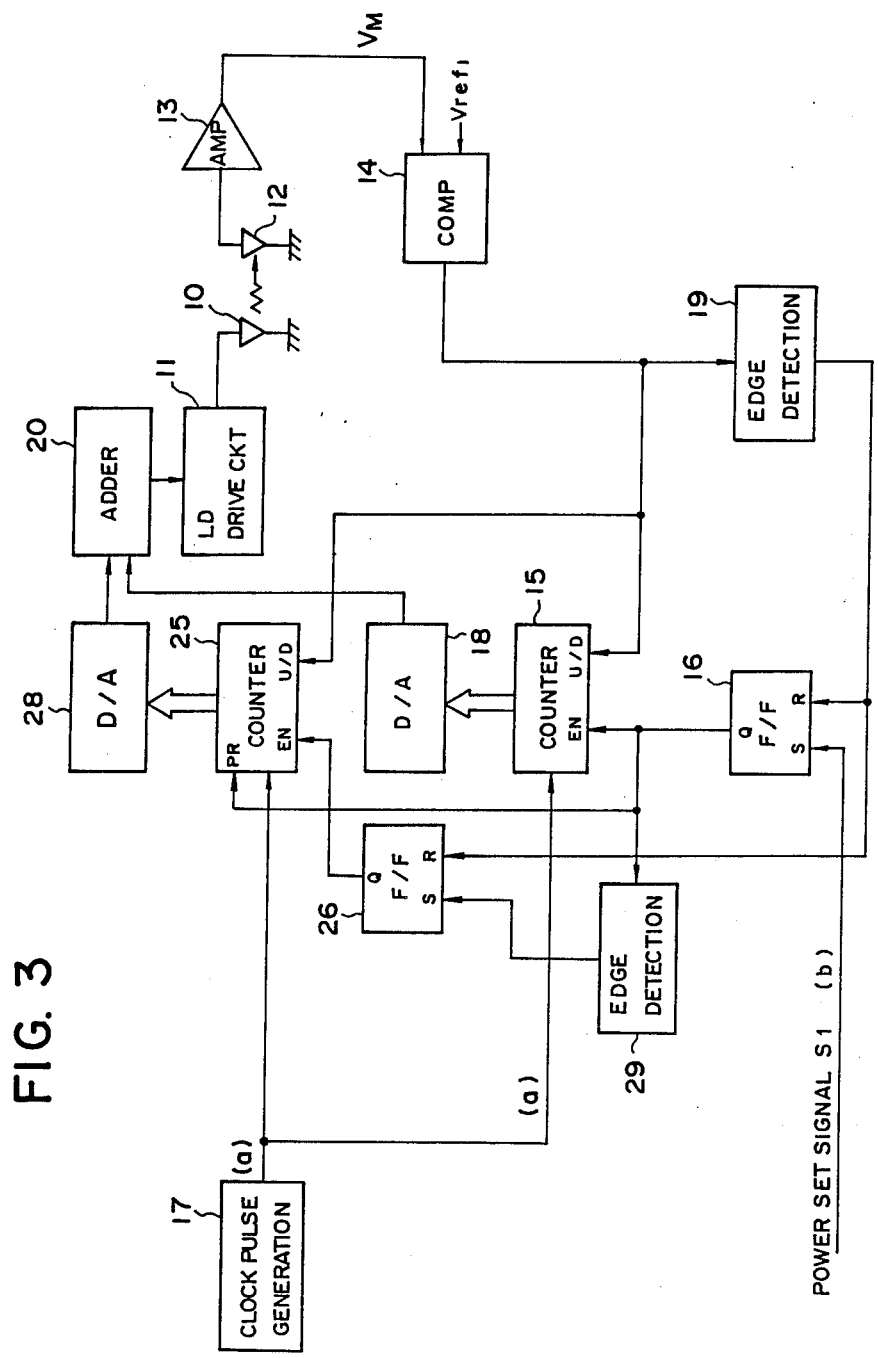
FIG. 3 is a block diagram of a preferred embodiment of the present invention.
Figure 4:
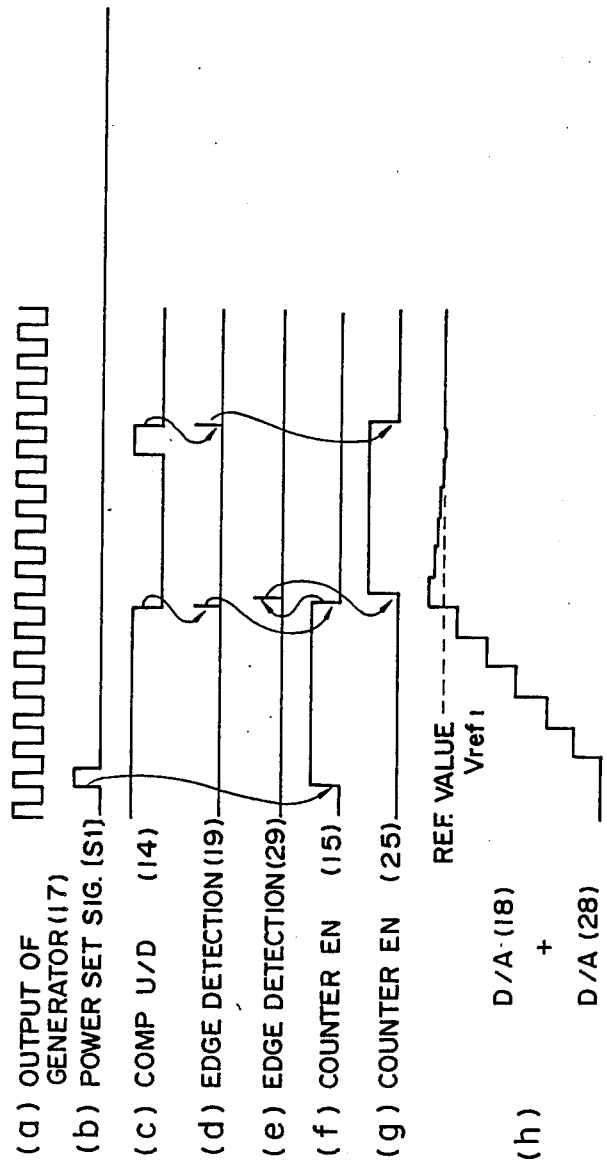
FIG. 4 is a timing chart illustrating an operation of the embodiment of FIG. 3.
Figure 5:
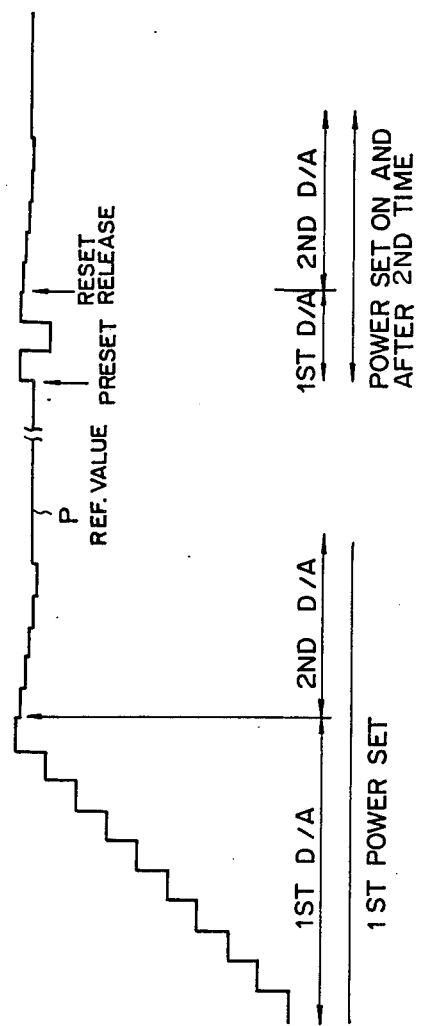
FIG. 5 is another timing chart illustration the operation of the embodiment of FIG. 3.

A description is given of a preferred embodiment of the present invention with reference to FIGS. 3 through 5. In FIG. 3, those parts which are the same as those in FIG. 1, are given the same reference numerals.

Referring to FIG. 3, the circuit configuration of the embodiment includes first and second output control circuits, and first and second D/A converters 18 and 28. The first output control circuit is made up of the counter 15 (hereafter referred to as first counter), the F/F 16 and the edge detection circuit 19. The second output control circuit is made up of an up/down counter (hereafter simply referred to as a second counter) 25, a flip-flop (F/F) 26 and an edge detection circuit 29. An adder 20 adds analog values supplied from the first and second D/A converters 18 and 28. It is noted that the quantization step size of the first D/A converter 18 is greater than that of the second D/A converter 28. That is, an output of the first D/A converter 18 can change greater than that of the second D/A converter 28. When the first power setting operation is completed, the count value counted by the second counter 25 is kept until the next (second) power setting operation is performed. The second D/A converter 28 is preset to a predetermined preset value by the second counter 25 in the power setting operation on and after the second time. Thereby, the first D/A converter 18 starts the preset value of the second D/A converter 28. Then when the intensity of light emitted from the laser diode 10 passes the reference value P, the second counter 28 starts operating.

A description is given of an operation in which a first reference value signal is produced at the output terminal of the first D/A converter 18. The first reference signal is used for roughly achieving the intensity of light emitted from the laser diode 10 sufficiently to write information on a recording medium. As described previously, a predetermined drive signal derived from the LD drive circuit 11 is supplied to the laser diode 10 at the commencement of the power setting operation (light intensity controlling operation). Then the laser diode 10 emits light beams forward and backward. The light beam emitted backward is received by the photosensor 12, which produces the current proportional to the light intensity of the laser diode 10. The current thus produced is converted into the voltage signal $V_M$ by the amplifier 13. The voltage $V_M$ is applied to the comparator 14, to which the reference voltage $V_{ref1}$ is also applied. The output voltage of the comparator 14 changes, depending the result of comparison between the voltage $V_M$ and the reference voltage $V_{ref1}$, and controls the counter mode of the first counter 15. For example, when the voltage $V_M$ is lower than the reference voltage $V_{ref1}$, or in other words, the light intensity of the laser diode 10 does not reach the reference value P, the comparator 14 keeps the output signal high. Thereby the up count mode is set in the first counter 15, which thereby functions as the up counter. On the other hand, when the voltage $V_M$ is higher than the reference voltage $V_{ref1}$, or in other words, the light intensity of the laser diode 10 exceeds the reference value P, the comparator keeps the output signal low. Thereby the down count mode is set in the first counter 15, which thereby functions as the down counter.

The F/F 16 is set by the power set signal S1 (FIG. 4(b)), which is applied at the commencement of the power setting mode (also referred to as a standby mode), and produces the output signal having the high level (FIG. 4(f)). This output signal is supplied to the enable terminal EN of the first D/A converter 18, which is released from the disabled state (FIG. 4(f)). Then, the first counter 15 counts up or down the clock pulse generated by the clock pulse generator 17 (FIG. 4(a)) in accordance with the output signal of the comparator 14 supplied to the up/down terminal of the first counter 15 as shown in FIG. 4(h).

The count value of the first counter 15 is converted into the analog signal by the first D/A converter 18, and is supplied to the LD drive circuit 11 through the adder 20. Thereby, the drive signal is varied in level, and the intensity of light emitted from the LD drive circuit 11 is changed. That is, as the count value of the first counter 15 increases (or decreases) gradually, the intensity of light emitted from the laser diode 10 increases (or decreases) gradually, and the voltage $V_M$ to be applied to the comparator 14 increases (or decreases) gradually.

When the voltage $V_M$ changes gradually and then the relationship in magnitude between the voltage $V_m$ and the reference voltage $V_{ref1}$ is inverted, the output signal of the comparator 14 is changed from the high level (or low level) to the low level (or high level). At this time, the edge detection circuit 19 the fall (or rise) of the output signal of the comparator 14 (FIG. 4(c)), and resets the F/F 16 (FIG. 4(d)). Thereby the first counter 15 returns to the disabled state (low level in FIG. 4(f)). As a result, the first counter 15 keeps the count value obtained at the time when the output signal of the comparator 15 is inverted. Hence, the magnitude of the drive current to be supplied to the laser diode is maintained as it is. At this time, the voltage $V_M$ becomes almost identical to the reference voltage $V_{ref1}$. Therefore, the intensity of light emitted from the laser diode 10 is roughly set to the reference value P corresponding to the reference voltage $V_{ref1}$. In this manner, the digital signal outputted from the first counter 15 in the case when the light intensity of the laser diode 10 is roughly set to the reference value P, is the first reference value signal.

The edge detection circuit 19 may be designed so as to have the first counter 15 disabled only when the output signal of the comparator 14 is switched from the high level to the low level. In this case, the operation at the time when the output signal of the comparator 14 is switched from the high level to the low level, is the same as the operation described previously. On the other hand, the following is the operation performed at the time when the output signal of the comparator 14 is switched from the low level to the high level. That is, when the output signal of the comparator 14 is switched from the low level to the high level, the first counter 15 continues to count the clock pulse as the up counter in a state where the first counter 15 is kept released from the disabled state. Then the drive current to be supplied to the laser diode 10 increases. When the output signal of the comparator 14 is switched from the high level to the low level (FIG. 4(c)), the edge detection circuit 29 detects the fall edge of the output signal of the comparator 14, and has the first counter 15 kept in the disabled state. Thereby, the count value in the first counter 15 is maintained at the value obtained when the output signal of the comparator 14 is switched from the high level to the low level.

In the alternative, the first counter 15 functions as the down counter during the time when the output signal of the comparator 14 is kept at the high level. In this case, the count value of the first counter 15 is set so as to be inversely proportional to the drive current for the laser diode 10. The description given previously with respect to the edge detection circuit 19 and the first counter 15 holds true for the second counter 25.

In the structure of FIG. 3, when the F/F 16 is reset, the first counter 15 returns to the disabled state, and simultaneously the second counter 25 is released from the preset mode in which the preset value is supplied to the second D/A converter 28.

As described previously, the output signal of the edge detection circuit 19 resets the F/F 16. When detecting the edge of the output signal of the F/F 16 (FIG. 4(e)), the edge detection circuit 29 sets the F/F 26. Thereby the F/F 26 produces the output signal kept at the high level. This is supplied to the second counter 25, which is released from the disabled state. As a result, the intensity of light emitted from the laser diode 10 is roughly set to the reference value P, and at the same time, the second counter 25 counts up or down the clock pulse supplied from the clock pulse generator 17 in accordance with the level of the comparator 14.

The count value of the second counter 25 is converted into the corresponding analog signal by the second D/A converter 28, and is then supplied to the LD drive circuit 11 through the adder 20. Thereby, the intensity of light emitted from the laser diode 10 increases or decreases with an increase or decrease of the count value of the second counter 25. Therefore, the light intensity of the laser diode 10 is adjusted where an adjustment level per one count value is smaller than that for the first D/A converter 18. That is, during the time where the second counter 25 is enabled, the drive current generated by the LD drive circuit 11 changes more precisely. As shown in FIG. 4(h), the drive current or the light intensity decreases gradually. Then when the output voltage $V_M$ becomes smaller than the reference voltage $V_{ref1}$, the output signal of the comparator 14 changes from the low level to the high level. Then the output signal of the comparator 14 falls. This level change in the output signal of the comparator 14 is detected by the edge detection circuit 19 (FIG. 4(d)). Then the edge detection circuit 19 produces the output signal, which is supplied to the F/F 26. Thereby, the F/F 26 is reset, and the second counter 25 returns to the disabled state. As a result, the second counter 25 maintains the current count value. This count value in the second counter 25 is the second reference value signal.

The first and second reference value signals may vary each time when the power setting operation if performed, or in other words, the power set signal S1 is supplied. However it is noted that after once the power setting is achieved, the first and second reference value signals do not vary until the next power setting operation is performed.

As described above, the intensity of light emitted from the laser diode 10 is roughly set to the reference value P by the output signal of the first D/A converter 18 having a smaller bit number (that is, the larger quantization step size), and is then precisely controlled by the output signal of the second D/A converter 28 so as to obtain the reference value. That is, the light intensity of the laser diode 10 is adjusted and set controlled by two control stages. As a result, it becomes possible to perform the power setting operation faster and more accurately.

Each time when the power setting operation is carried out on and after the second time, the power set signal S1 is supplied to the set terminal of the F/F 16. In this case, the power setting operation starts from the intensity maintained by the preceding power setting operation.

Figure 6:
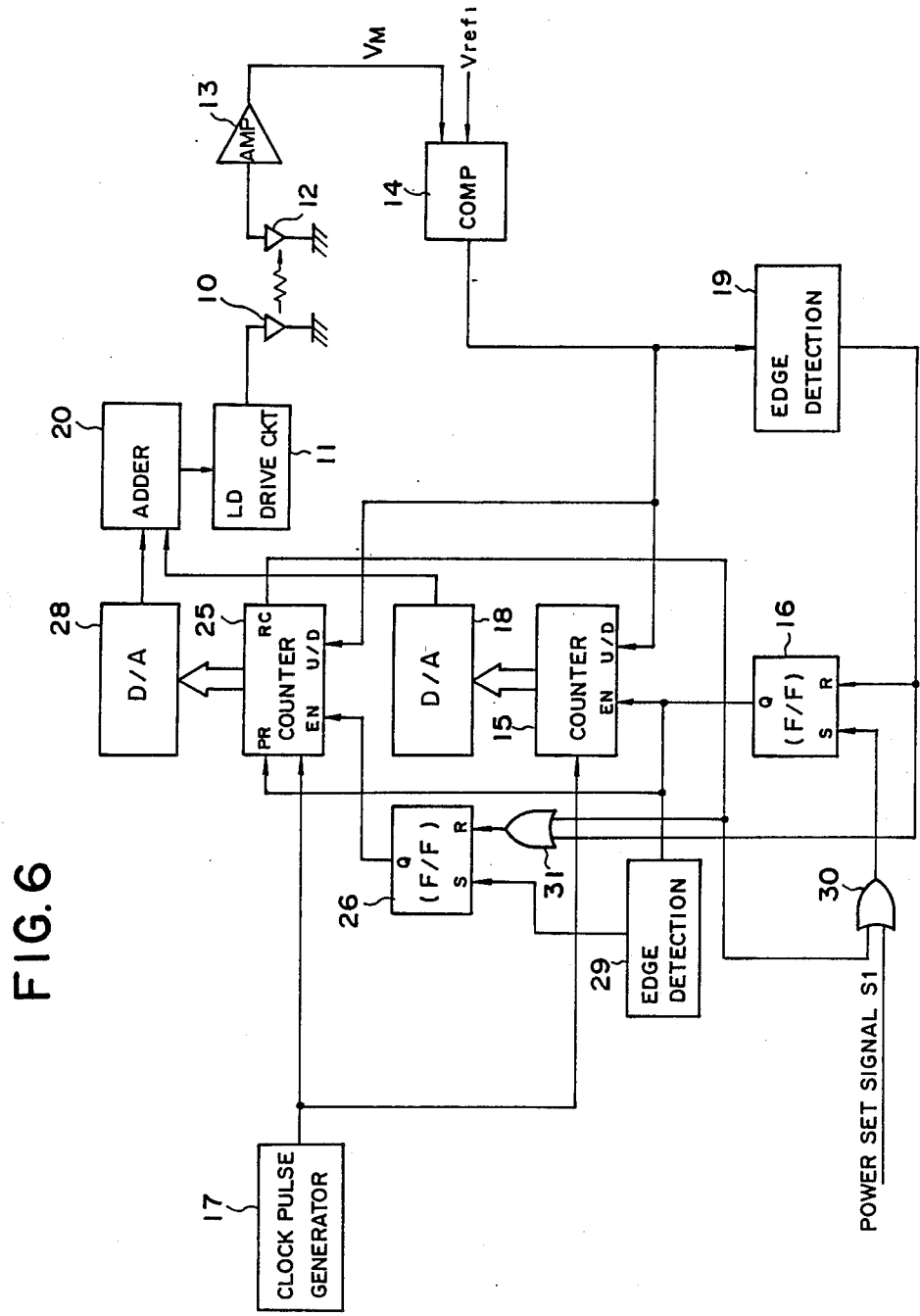
FIG. 6 is a block diagram of a variation of the embodiment of FIG. 3.

A variation of the above-mentioned embodiment is illustrated in FIG. 6. The variation is constructed by adding OR gates 30 and 31 to the configuration of FIG. 3. A ripple carry signal RC is supplied to the set terminal of the F/F 16 and the reset terminal of the first counter 15 through the OR gates 30 and 31, respectively. In operation, when the power set signal S1 is supplied to the F/F 16 through the OR gate 30, it is set, and releases the first counter 15 from the disabled state. Also when a ripple carry signal RC is outputted from the second counter 25, the F/F 26 is reset. At this time, the second counter 25 is set to the disabled state, and the F/F 16 is set so that the first counter 15 is released from the disabled state.

In the structure shown in FIG. 3, in a case when the second counter 25 outputs a borrow signal, and if the count value outputted from the adder 20 still exceeds the reference value P, it is impossible to enable the first counter 15 and thereby set the light intensity to the reference value P. According to the variation of FIG. 6, the above-mentioned problem can be eliminated.

Figure 7:
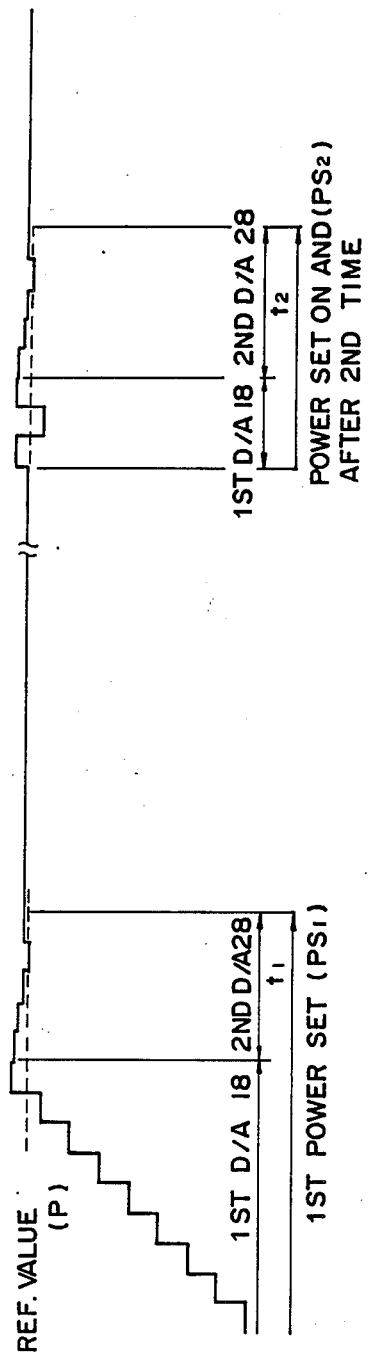
FIG. 7 is a timing chart illustrating an operation of the variation of FIG. 6.

A description is given of an improvement of the embodiments described previously. In the embodiments of FIGS. 3 and 6, on and after the second time of the power setting operation, the second D/A counter 28 is preset by the second counter 25, and the first D/A converter 18 starts controlling the light intensity from the maintained count value thereof. Then, as in the case of the first power setting operation, the second D/A converter 28 starts operating, and adjusts the count value so as to obtain the reference value P. In this manner, on and after the second time of power setting operation, it takes a time almost identical to the time necessary for the first power setting operation ($t_2 = t_1$ shown in FIG. 7) to control the light intensity. Sometimes even when the power set is not completed, the light emitted from the laser diode is used for writing image data on the recording medium (not shown). Additionally, since the laser diode is kept ON during the power setting operation, great variations in the light intensity appear, which are not described.

Figure 8:
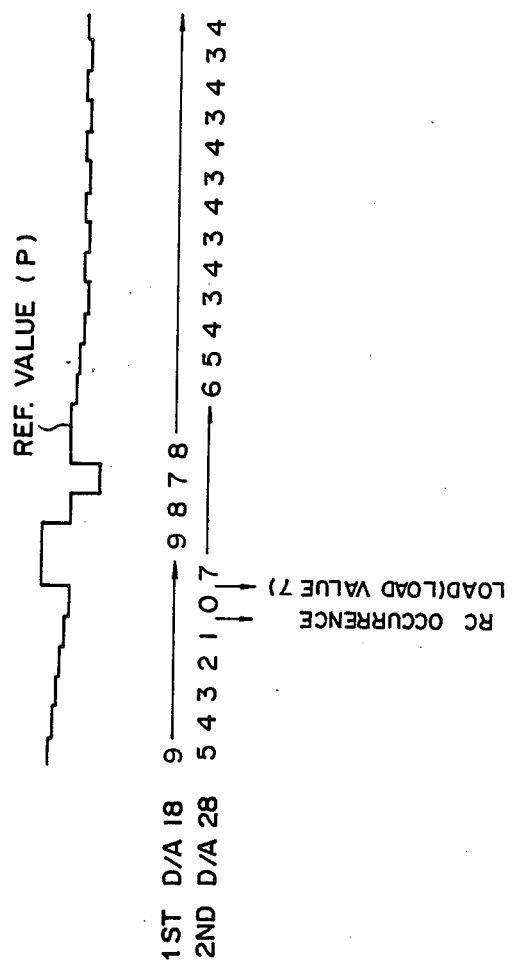
FIG. 8 is another timing chart of the variation of the embodiment of FIG. 6.

FIG. 8 shows an example of cases when the second D/A converter 28 shown in FIG. 6 becomes uncontrollable. The controllable range by the second output control circuit including the second D/A converter 28 is small. Therefore, when the light intensity is outside the above range, the output control circuit controls the light intensity no longer. At this time, the output control is temporarily shifted to the first output control circuit including the first D/A converter 15. In the following description, it is assumed that the second D/A converter 28 outputs a 3-bit digital output (0–7). The following description holds true for cases in which the second D/A converter 28 outputs digital signals other than the bit number equal to 3 bits. When the counter 25 decreases the count value like a step, and generates a borrow and then outputs the ripple carry signal RC, the second D/A converter 28 is preset (a loaded value is 7, in the illustrated example), and the first D/A converter 18 starts counting from the maintained count value (a value of 9). When the light intensity decreases and reaches the reference power value P, the output signal of the comparator 14 is switched from the low level to the high level. Thereby the F/F 16 is reset, so that the first counter 15 is set to the disabled state. Thereby, the first counter 15 maintains a value of 8. On the other hand, at this time, the second counter 25 starts to count the clock pulse, and the count value changes as follows: 7→6→5→4→3→4. That is, during a time when the count value of the first counter 15 varies between values of 9 and 8, there is no change in the output of the second counter 25, and the laser diode 10 is controlled, depending on the output signal of the first D/A converter 18.

The two embodiments of the present invention mentioned previously can overcome the disadvantages of conventional semiconductor laser control apparatuses. However, there is a room for improvement. That is, large variations in the light intensity of the laser diode 10 occur in the power setting operation on and after the second time. In addition, a long time is taken to adjust the light intensity on and after the second time of the power setting operation.

Figure 9:
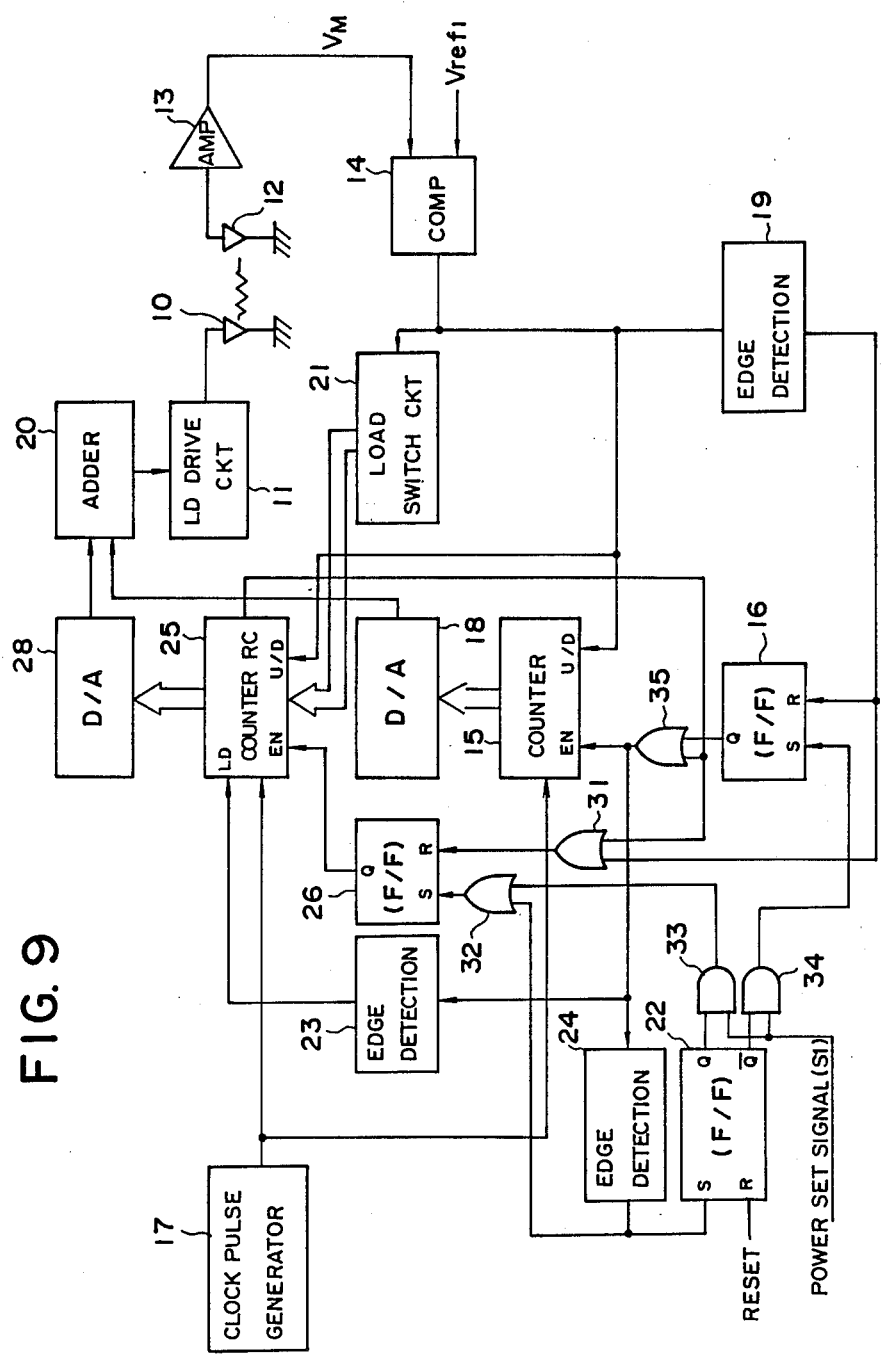
FIG. 9 is a block diagram of another preferred embodiment of the present invention.

An improvement is directed to eliminate the above-mentioned matters desired to be improved. Improvements are described with reference to FIGS. 9 through 12 and FIGS. 13A through 13D. In FIG. 9, those parts which are the same as those in the previous figures, are indicated by the same reference numerals.

Referring to FIG. 9, a load value switch circuit 21 provides the second counter 25 in the second output control circuit with a load value depending on the output signal of the comparator 14. A flip-flop 22 is supplied with a reset signal RESET. The power set signal S1 is switchable between the F/Fs 16 and 26 due to the function of AND gates 33 and 34. Q and $\overline{Q}$ output signals of the F/F 22 are supplied to the AND gates 33 and 34, respectively. An output terminal of the AND gate 33 is connected to an OR gate 32, and an output terminal of the AND gate 34 is connected to the set terminal of the F/F 16. A set terminal of the F/F 22 is supplied with the output signal of the edge detection circuit 24, which is also supplied to the OR gate 32. An output terminal of the OR gate 32 is connected to the set terminal of the F/F 26. The output signal of the F/F 16 is supplied to the enable terminal of the first counter 15 through an OR gate 35, which is also supplied with the ripple carry signal RC derived from the second counter 25.

Figure 10:
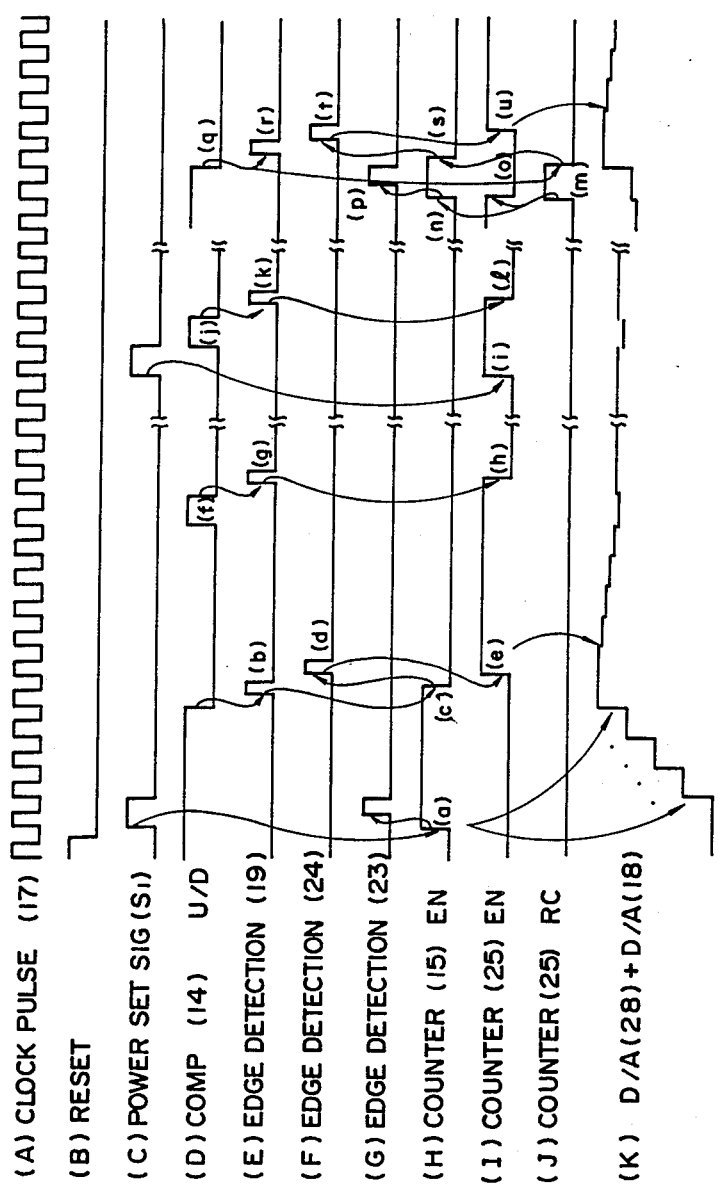
FIG. 10 is a timing chart illustrating an operation of the embodiment of FIG. 9.

The generation of the first reference value signal by the first output control circuit is described with reference to FIG. 10. As described previously, the first reference value signal is used for roughly setting the intensity of light emitted from the laser diode 10.

Figure 13A:
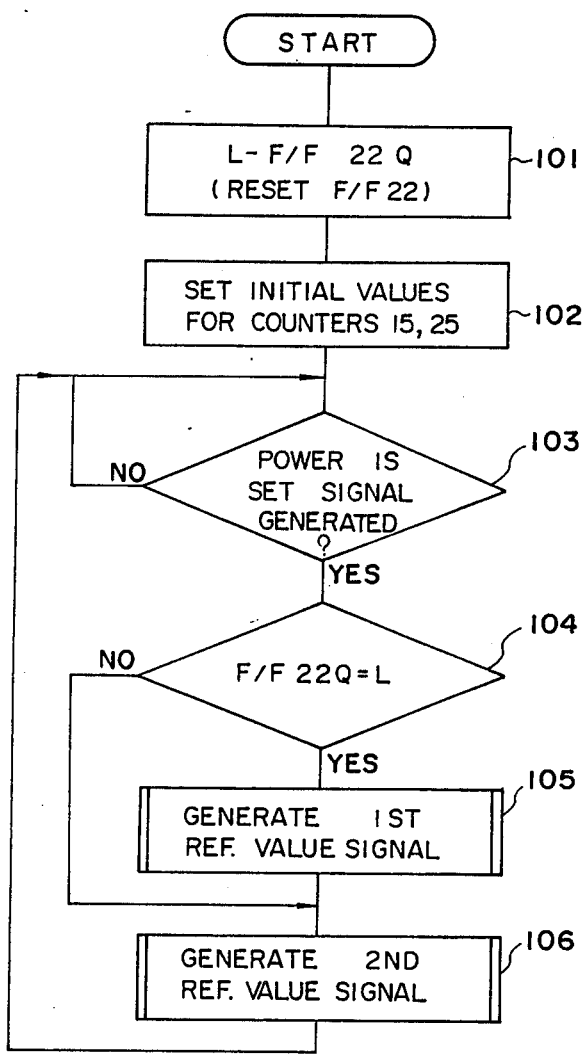
FIGS. 13A through 13D are flow charts illustrating the operation of the embodiment of FIG. 9.

As shown in FIG. 13A illustrating a main routine of the intensity controlling operation in the embodiment of FIG. 9, after the reset signal is supplied to the reset terminal of the F/F 22, which thereby outputs the Q-terminal output signal (step 101). Then the clock pulse derived from the clock pulse generator 17 shown in FIG. 10(A) is supplied to the first and second counters 15 and 25, whereby an initial value is set in each of the first and second counters 15 and 25 (step 102). The drive signal for driving the laser diode 10 is supplied to the LD drive circuit 11. Then, the light beams are emitted forward and backward from the laser diode 10.

Figure 13B:
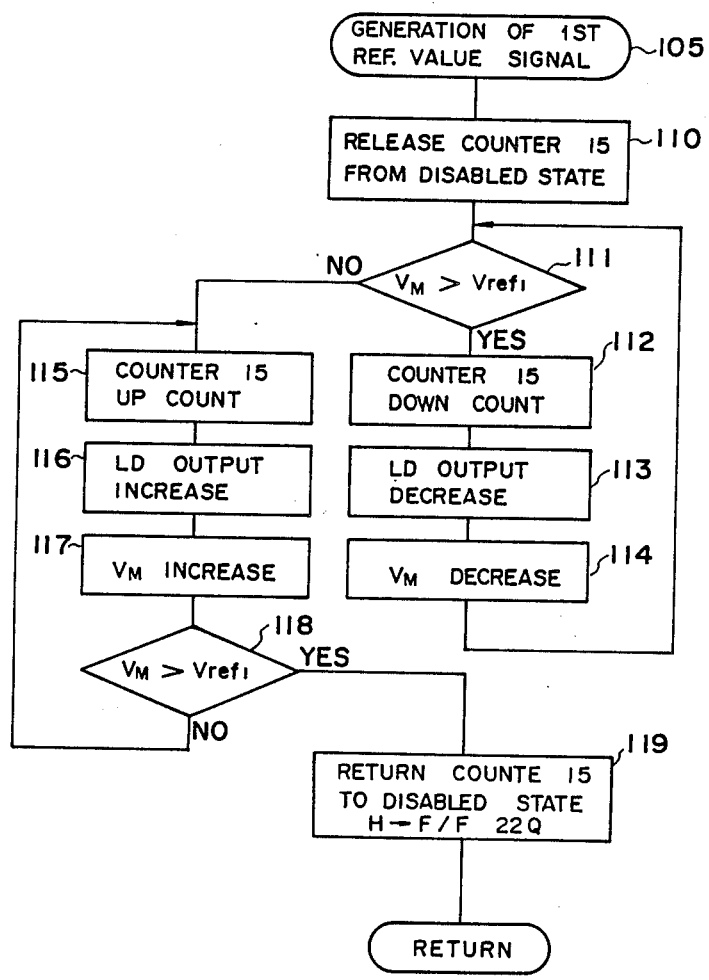

The backward light is received by the photosensor 12, which produces current proportional to the intensity of the light received by the photosensor 12. The generated current is converted into the corresponding voltage $V_M$ in the amplifier 13. Then the voltage $V_M$ is compared with the reference voltage $v_{ref1}$ in the comparator 14. The output signal of the comparator 14 is switchable between the low and high levels, depending on the relationship in magnitude between the voltage $v_M$ and the reference voltage $V_{ref1}$. The output signal of the comparator 14 is supplied to the first counter 15, and determines the count mode to be set in the first counter 15. Then a processing routine shown in FIG. 13B is performed. For example, when the voltage $V_M$ is smaller than the reference voltage $V_{ref1}$, or the light intensity of the laser diode 10 does not reach the reference intensity level P, the comparator 14 outputs the comparison result kept at the high level. Thereby, the first counter 15 functions as the up counter. On the other hand, when the voltage $V_M$ exceeds the reference voltage $v_{ref1}$, the first counter 15 functions as the down counter.

The above-mentioned counter operation of the first counter 15 is activated as follows. When the reset signal is switched from the high level to the low level, the power set signal S1 is supplied to the F/F 16 through the AND gate 34. Then the output signal of the F/F 16 is supplied to the first counter 15 through the OR gate 35. This is indicated by reference (a) in FIG. 10(H).

At this time, since the output signal of the comparator 14 is kept at the high level (FIG. 10(D)), the first counter 15 is set to the up count mode. Therefore, the output signal of the first D/A converter 18 increases gradually (FIG. 10(K)), and is supplied to the LD drive circuit 11 through the adder 20. Then the LD drive circuit 11 increases the intensity of light emitted from the laser diode 10. When the output voltage $V_M$ becomes smaller than the reference voltage $V_{ref1}$, the edge detection circuit 19 detects the fall of the output signal of the comparator 14, and produces the detection signal indicated by reference (b) in FIG. 10(E). The detection signal is supplied to the reset terminal of the F/F 16, which supplies the first counter 15 with the signal kept at the low level. Thereby, as indicated by reference (c) in FIG. 10(H), the count operation of the first counter 15 is stopped. The fixed count value which is roughly determined by the above-mentioned initial operation is applied to the LD drive circuit 11 as the reference. At the same as the first counter 15 is disabled, the edge detection circuit 24 detects the fall of the signal (indicated by reference (c) in FIG. 10(H) to be supplied to the enable terminal of the first counter 15, and produce the edge detection signal indicated by reference (d) in FIG. 10(F). The edge detection signal is supplied to the enable terminal of the second counter 25 through the F/F 26, and thereby the second counter 25 starts to count the clock pulse supplied from the clock pulse generator 17. This is indicated by reference (e) in FIG. 10(I). Then the processing routine shown in FIG. 13C starts.

Due to the function of the edge detection signal indicated by reference (d) in FIG. 10(F), the F/F 22 is set and the power set signal S1 shown in FIG. 10(C) is supplied to the F/F 26. As describe above, the output signal of the comparator 14 is kept at the low level. Therefore, the second counter 25 is kept in the down count mode. As the second counter 25 counts down the clock pulse, the output of the second D/A converter 28 decreases as shown in FIG. 10(K), and changes the drive current supplied to the laser diode 10 so that the intensity of light emitted from the laser diode 10 decreases.

Next, when the output signal of the comparator 14 is switched from the low level to the high level as indicated by reference (f) in FIG. 10(D), the second counter 25 becomes operable as the up counter. Then the output of the second D/A converter 28 begins increasing, and correspondingly the light intensity of the laser diode 11 begins increasing. When the output signal of the comparator 14 is inverted again (from high level to low level), the edge detection circuit 19 detects the fall of the output signal of the comparator 14, and produces the edge detection signal as indicated by reference (g) in FIG. 10(E). This edge detection signal is supplied to the enable terminal of the second counter 25 through the F/F 26, whereby the second counter 25 is inactivated as indicated by reference (h) in FIG. 10(I). By the above-mentioned operation, the second output control circuit maintains the counter value of the second counter 25.

After that, when the power set signal S1 shown in FIG. 10(C) is supplied to the AND gates 33 and 34, the power setting (light intensity control) operation is carried out by the second output control circuit. The power set signal S1 passes through the AND gate 33 and the OR gate 32, and is supplied to the F/F 26. Thereby, the second counter 25 is enabled as shown by reference (i) in FIG 10(I). At this time, since the output of the comparator 14 is at the low level, the output of the second D/A converter 28 decreases as shown in FIG. 10(K). Accordingly, the drive current derived from the LD drive circuit 11 also decreases, so that the light intensity of the laser diode 10 decreases.

Then when the output signal of the comparator 14 is switched from the low level to the high level as indicated by reference (j) in FIG. 10(D), the second counter 25 becomes operable as the up counter. Then the output of the second D/A converter 28 is inverted so as to increase the count value, and thereby the light intensity of the laser diode 10 is changed to increase. When the output signal of the comparator 14 is inverted again from the high level to the low level as indicated by reference (j), the edge detection circuit 19 detects the fall, and generates the edge detection signal indicated by reference (k) in FIG. 10(E). This edge detection signal set to the low level is supplied to the enable terminal of the second counter 25 through the F/F 26, so that the second counter 25 stops the count operation as indicated by reference (l) in FIG. 10(I).

Figure 12:
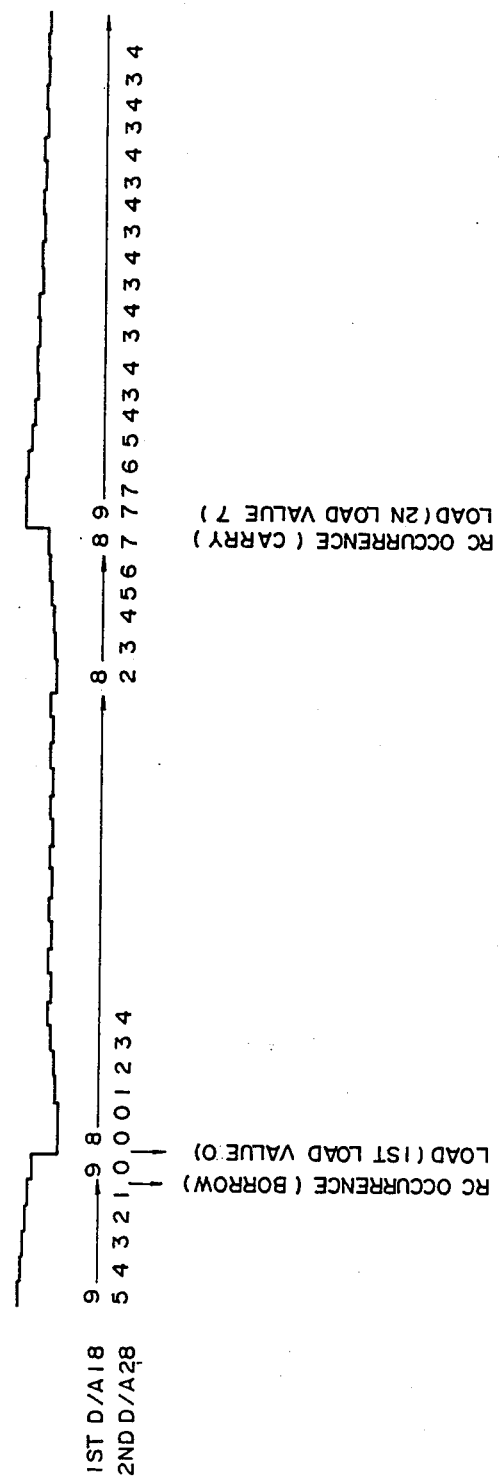
FIG. 12 is still another timing chart illustrating the operation of the embodiment of FIG. 9.
Figure 13C:
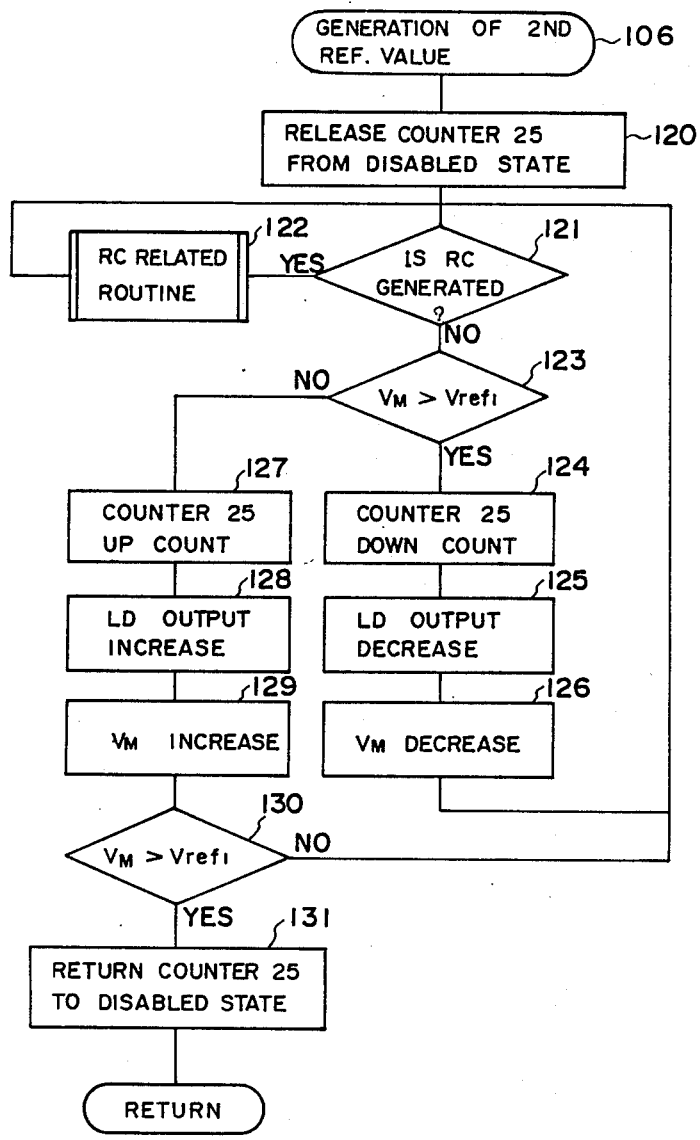
Figure 13D:
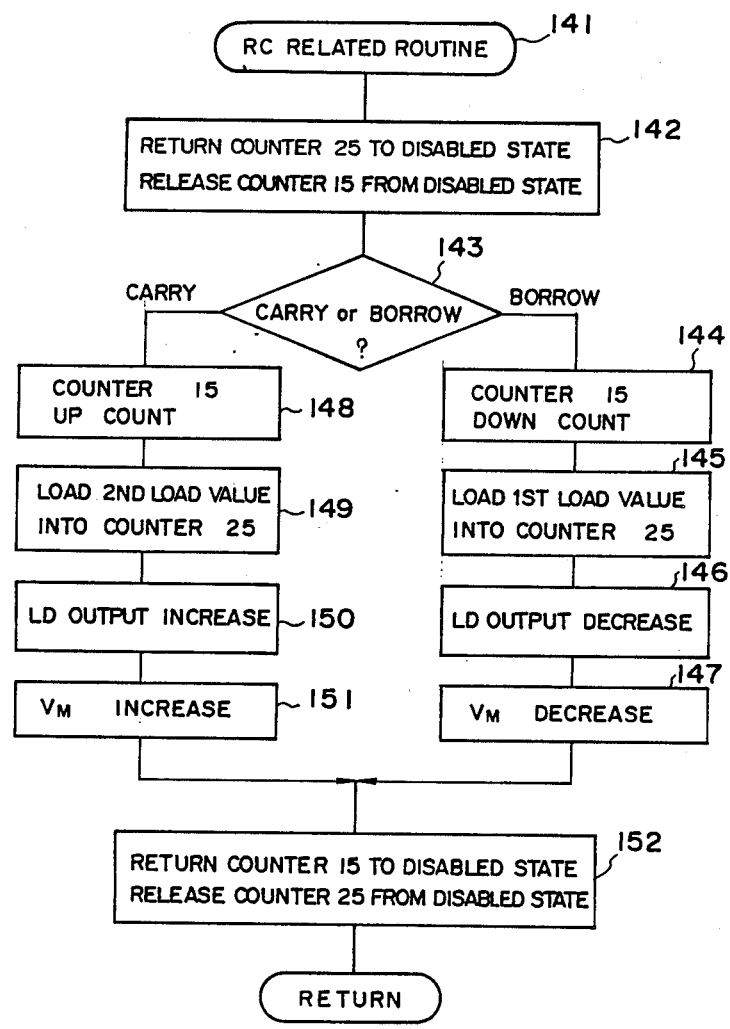

A description is given of a ripple carry processing routine shown in FIG. 13D. During a time when a second counter 25 is set in the up count mode, when the carry occurs in the second counter 25 and therefore it becomes impossible to control the laser diode 10 by the second output control circuit, the ripple carry (RC) terminal of the second counter 25 is switched to the high level as indicated by reference (m) in FIG. 10(J). Then the enable terminal of the first counter 15 is changed to the high level as indicated by reference (n) in FIG. 10(H), in accordance with the signal supplied from the RC terminal of the second counter 25 indicated by reference (m) in FIG. 10(J). Thereby the first counter 15 starts counting the clock pulse as indicated by reference (n) in FIG. 10(H), and the count value increases like a step (the value change 8→9 in FIG. 12). Additionally, the signal supplied from the ripple carry terminal of the second counter 25 is supplied to the enable terminal of the second counter 25 through the OR gate 31 and the F/F 26, whereby it stops the count operation a indicated by reference (o) in FIG. 10(I).

On the other hand, the enable terminal of the first counter 15 is switched to the high level as described previously. The edge detection circuit 23 detects the rise of this change as indicated by reference (n) in FIG. 10(H), and produces the edge detection signal as indicated by reference (p) in FIG. 10(G). In response to this edge detection signal, the load value (a load value of 7 shown in FIG. 12; the second load value) is loaded into the second counter 25. At this time, since the count value of the first counter 15 is increased by one step, the output of the first D/A converter 18 also increases as shown in FIG. 10(K), and the light intensity of the laser diode 11 increases.

When the output of the comparator 14 is inverted (from high level to low level) as indicated by reference (q), the edge detection circuit 19 detects the fall of the above change, and produces the edge detection signal indicated by reference (r) in FIG. 10(E). In response to the edge detection signal, the ripple carry terminal of the second counter 25 is switched to the low level, and thereby the count operation of the first counter 15 stops as indicated by reference (s) in FIG. 10(H). The edge detection circuit 24 detects the fall from the high level to the low level of the signal at the enable terminal of the first counter 15, and produces the edge detection signal indicated by reference (t) in FIG. 10(F). The above edge detection signal is supplied to the enable terminal of the second counter 25 through the F/F 26, and makes the enable terminal level high as indicated by reference (u) in FIG. 10(I). Thereby the second counter 25 starts operating. Since the count value of the second counter 25 is a maximum value at this time and the output of the comparator 14 is kept at the low level, the output of the second D/A converter 28 decreases and the light intensity of the laser diode 11 also decreases. The signal at the ripple enable terminal of the second counter 25 becomes the low level at the time when the output signal of the comparator 14 is switched to the low level as indicated by reference (g).

The second load value loaded into the second counter 25 is a load value supplied from the load value switch circuit 21. The load switch circuit 21 has the two load values, namely, the first and second load values, and provides the second counter 25 with the selected one of the load values. When the output signal of the comparator 14 is kept at the low level, the load value switch circuit 21 selects the first load value. On the other hand, when the output signal of the comparator 14 is kept at the high level, the load value switch circuit 21 selects the second load value. When the load input terminal LD is at the high level, the load value supplied from the load value switch circuit 21 is loaded into the second counter 25.

As shown in FIG. 12, when a borrow occurs in the second counter 25, the first counter 15 decreases by one step, and the first load value equal to 0 is loaded into the second counter. Then the second counter 25 increases the count value gradually as shown in FIG. 12.

In place of the above-mentioned operation it is possible to constitute the circuit operation in which when the output signal of the comparator 14 is at the high level, the first counter 15 functions as the down counter, and the LD drive circuit 11 decreases the drive current as the outputs of the D/A converters 18 and 28 increase, and the D/A converters 18 and 28 decrease the respective outputs as the count values of the first and second counters 15 and 25 increase.

In the embodiment of FIG. 9, the loading of the first load value (borrow) and the second load value (carry) is based on the countable maximum and minimum values of the second counter 25. Alternatively, it is possible to load the first and second values on the basis of other values.

Figure 11:
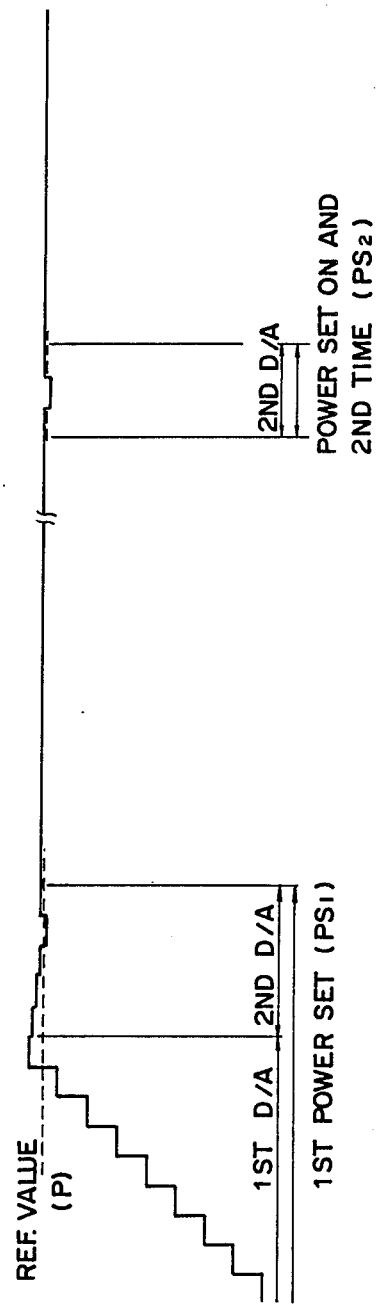
FIG. 11 is another timing chart illustrating the operation of the embodiment of FIG. 9.

FIG. 11 shows output states of the D/A converters 18 and 28 shown in FIG. 9. The first power setting operation (PS1) is identical to that of the embodiments shown in FIGS. 3 and 6. The power setting operation on and after the second time (PS2) is different between the embodiment of FIG. 9 and each of the embodiments of FIG. 3 and 6. That is, in the power setting operation on and after the second time in the embodiment of FIG. 9, the output value of the first D/A converter 18 is maintained, and the second D/A converter 28 starts control from the value maintained in the first D/A converter 18. Then when the power setting operation is completed, the output value of the second D/A converter 28 is maintained.

FIG. 13A through 13D are flowcharts of the above-mentioned operations of the embodiment of FIG. 9. FIG. 13A shows a main flow, FIG. 13B shows a flow with respect to the generation of the first reference value signal, FIG. 13C shows a flow with respect to the generation of the second reference value signal, and FIG. 13D shows a flow of a routine with respect to the ripple carry RC.

Referring to FIG. 13A, the F/F 22 is reset (step 101), and the initial value is set to each of the first and second counters 15 and 25 (step 102). When the power set signal is supplied to the circuit of FIG. 9 (step 103), one of the first and second reference value signals is generated. In the first power setting operation, since the output of the FF 22 is kept at the low level (step 104), the first reference value signal is generated (step 105). In the power setting operation on and after the second time, the second reference value signal is generated (step 106). The detailed procedures in steps 105 and 106 are shown as sub-routines in FIGS. 13B and 13C, respectively.

The generation of the first reference value signal commences to release the first counter 15 from the disabled state (step 110). Then it is discriminated whether or not the voltage $V_M$ supplied from the amplifier 13 is greater than the reference voltage $V_{refl}$ (step 111). If the discrimination result is YES, the first counter 15 is set to the down count mode (step 112). Thereby, the light intensity of the laser diode 10 decreases (step 113), and the voltage $V_M$ of the amplifier 13 also decreases (step 114). The procedure returns to step 111. On the other hand, if the discrimination result in step 111 is NO, the first counter 15 is set to the up count mode (step 115). Thereby, the light intensity of the laser diode 10 increases (step 116), and the output voltage $V_M$ of the amplifier 13 also increases (step 117). Then, it is discriminated whether or not the voltage $V_M$ is greater than the reference voltage $V_{refl}$ (step 118). If the discrimination result is NO, the procedure returns to step 115. Adversely, if the discrimination result in step 118 is YES, the first counter 15 returns to the disabled state, and the F/F 22 is set so as to produce the output kept at the high level (step 119).

As shown in FIG. 13C, the generation of the second reference value signal commences releasing the second counter 25 from the disabled state (step 120). Then it is detected whether or not the ripple carry RC occurs (step 121). If the discrimination result is YES, the procedure proceeds to step 112, and if the discrimination result is NO, the procedure proceeds to step 123. A sequence starting from step 123 is the same as that starting from step 111 shown in FIG. 13B.

The RC related routine in step 122 starts with a step in which the second counter 25 returns to the disabled state and releases the first counter 15 from the disabled state (step 142). By this process the first reference value signal is allowed to change, and the second reference value signal is locked. Then it is discriminated whether the occurrence of the ripple carry results from the carry or borrow (step 143). If the ripple carry is a borrow, the first counter 15 is set to the down count mode (step 144). Then the first load value is loaded into the second counter 25 (step 146). Thereby, the intensity of light emitted from the laser diode 10 decreases, and correspondingly the output voltage $V_M$ of the amplifier 14 also decreases. On the other hand, if the ripple carry is a carry in step 143, the up count mode is set in the first counter 15 (step 148). Then, the second load value is loaded into the second counter 25 (step 149). Thereby the light intensity of the laser diode 10 increases (step 150), and therefore the output voltage $V_M$ of the amplifier 13 increases (step 151). Then step 152 is performed in which the first counter 15 returns to the disabled state, and the second counter 25 is released from the disabled state.

The present invention is not limited to the above-mentioned embodiments, and variations and modifications may be made without departing from the scope of the present invention.

What is claimed is:

1. A semiconductor laser control apparatus for controlling an intensity of light emitted from a semiconductor laser by controlling a drive current to be supplied to said semiconductor laser, comprising
monitor means for monitoring the intensity of light emitted from said semiconductor laser;

first means for roughly determining a first value of the drive current by using the intensity of light monitored by said monitor means so as to obtain a intensity of light near a desired intensity of light emitted from said laser diode;

second means for precisely determining a second value of the drive current by using the intensity of light monitored by said monitor means so as to obtain the desired intensity of light, after determining the first value of the drive current by said first means; and adder means for adding said first value of the drive current determined by said first means and said second value of the drive current determined by said second means, the drive current having an added value being supplied to said semiconductor laser.

2. A semiconductor laser control apparatus as claimed in claim 1, wherein said monitor means comprises means for obtaining an output signal corresponding to the intensity of light emitted from said semiconductor laser, comparator means for comparing said output signal with a reference signal, and first edge detection means for detecting a change in an output signal indicating a comparison result obtained by said comparator means.

3. A semiconductor laser control apparatus as claimed in claim 2, wherein said first means comprises a first flip-flop having a reset terminal connected to said first edge detection means and a set terminal supplied with a power set signal supplied from an external circuit when a power setting operation is performed, a first up/down counter counting a predetermined clock pulse and having an up/down terminal connected to said comparator means and an enable terminal connected to said first flip-flop, and a digital-to-analog converter having an input terminal connected to said first up/down counter and an output terminal connected to said adder means.

4. A semiconductor laser control apparatus as claimed in claim 3, wherein said second means comprises second edge detection means for detecting a change in an output signal of said first flip-flop, a second flip-flop having a reset terminal connected to said first edge detection means and a set terminal connected to an output of said second edge detection means, a second up/down counter counting said clock pulse and having an up/down terminal connected to said comparator means and an enable terminal connected to said second flip-flop, and a second digital-to-analog converter having an input terminal connected to said second up/down counter and an output terminal connected to said adder means.

5. A semiconductor laser control apparatus as claimed in claim 4, wherein a quantization step size of said first digital-to-analog converter is larger than a quantization step size of said second digital-to-analog converter.

6. A semiconductor laser control apparatus as claimed in claim 4, wherein said second up/down counter comprises a preset terminal connected to said first flip-flop, and wherein said first flip-flop is set, the second up/down counter supplies said second digital-to-analog converter with a preset value.

7. A semiconductor laser control apparatus as claimed in claim 4, wherein said second up/down counter comprises a ripple carry terminal coupled with said set terminal of said first flip-flop and reset terminal of said second flip-flop, and wherein when a carry or borrow occurs in the said second up/down counter, first up/down counter is enabled.

8. A semiconductor laser control apparatus as claimed in claim 1, wherein once the second means determines the second value of the drive current, the second means maintains the second value of the drive current.

9. A semiconductor laser control apparatus as claimed in claim 4, further comprising gate means for passing through said power set signal to be supplied to the set terminal of said first flip-flop in the first power setting operation and inhibiting said power set signal from passing therethrough in the power setting operation on and after the second time, so that the power setting operation on and after the second time is performed without enabling the first up/down counter.

10. A semiconductor laser control apparatus as claimed in claim 7, further comprising load switch means for providing said second up/down counter with one of predetermined load values when said borrow or carry is generated.

11. A semiconductor laser control apparatus as claimed in claim 10, wherein said load switch means comprises first and second load values corresponding to maximum and minimum values countable by said second up/down counter.

12. A semiconductor laser control apparatus as claimed in claim 10, wherein said load switch means selects one of said first and second load values on the basis of said comparator means.

* * * * *